United States Patent [19]

Eguchi

[11] Patent Number: 5,028,982
[45] Date of Patent: Jul. 2, 1991

[54] SEMICONDUCTOR DEVICE

[75] Inventor: Kouzi Eguchi, Itami, Japan

[73] Assignee: Mitsubishi Denki Kabushiki Kaisha, Tokyo, Japan

[21] Appl. No.: 59,177

[22] Filed: Jun. 8, 1987

Related U.S. Application Data

[63] Continuation of Ser. No. 809,883, Dec. 17, 1985, abandoned.

[30] Foreign Application Priority Data

Feb. 20, 1985 [JP] Japan .................................. 60-33735

[51] Int. Cl.$^5$ .............................................. H01L 23/54
[52] U.S. Cl. ........................................ 357/68; 357/67
[58] Field of Search ..................... 357/54, 68, 71, 67

[56] References Cited

U.S. PATENT DOCUMENTS 3,868,723  2/1975  Lechaton et al. ...................... 357/54
4,524,508  6/1985  Sato ...................................... 357/54

FOREIGN PATENT DOCUMENTS 59-200440  11/1984  Japan .
2088629  6/1982  United Kingdom .

OTHER PUBLICATIONS

Patent Abstracts of Japan, vol. 9, No. 61, Mar. 19, 1985, "Manufacture of Wiring Structure", Tooru Mogami.
"Study of Planarized Sputter-Deposited SiO$_2$", by C. Y. Ting et al., Journal of Vacuum Science and Techology, vol. 15, No. 3, May/Jun., 1978, pp. 1105-1112.
"SiO$_2$ Planarization by RF Bias Sputtering", by T. Mogami et al., 25th Symposium on Semiconductor Integrated Circuits Technique, Dec. 26, 1983.

Primary Examiner—Rolf Hille
Assistant Examiner—S. V. Clark
Attorney, Agent, or Firm—Lowe, Price, LeBlanc and Becker

[57] ABSTRACT

To cover the interconnection (2) on a semiconductor device (1) at high speed with an insulating film (3) having good step coverage, a dummy pattern (8) is provided around the interconnection (2) and the dummy pattern (8) and the interconnection (2) are covered with the insulating film (3) using the bias sputtering method.

5 Claims, 1 Drawing Sheet

SEMICONDUCTOR DEVICE

This application is a continuation of U.S. application Ser. No. 809,883, filed Dec. 17, 1985, abandoned.

BACKGROUND OF THE INVENTION

1. Field of the Invention

This invention relates to an improved interlayer insulating film or passivation film used in a semiconductor device.

2. Description of the Prior Art

FIG. 1 is a cross-sectional illustration of an insulating film formed by using the conventional CVD (chemical vapor deposition) method. In FIG. 1, an interconnection 2 of, e.g., Al is formed on a semiconductor substrate 1 and an insulating film 4 is formed by using the CVD method to cover the semiconductor substrate 1 and Al interconnection 2. As can be clearly seen in FIG. 1, when an insulating film is formed by using the CVD method, it often happens that the coverage of the insulating film 4 is poor, and further, necking takes place in step portions. This drawback is peculiar to the CVD method and could be remedied to some extent by suitably selecting the film forming conditions, but cannot be completely eliminated, forming the greatest obstacle to the formation of multilayer interconnections and the like. Thus, the bias sputtering method has been invented to eliminate the aforesaid drawback peculiar to the CVD method.

FIG. 2 is a cross-sectional illustration of an insulating film formed by using the bias sputtering method. In FIG. 2, after an Al interconnection 2 has been formed on a semiconductor substrate 1, a flat insulating film 3 is formed by using the bias sputtering method to cover the semiconductor substrate 1 and Al interconnection 2. As can be seen in FIG. 2, the insulating film forming method using the bias sputtering method is an epochal one capable of perfectly planarizing the insulating film 3 under particular conditions even if there are step portions due to the presence of the Al interconnection 2. Particularly where the width of the interconnection 2 is less than twice the thickness of an insulating film to be formed thereon, perfect planarization of the insulating film 3 is possible. The bias sputtering method consists in performing sputter etching by applying a bias voltage to the substrate 1 while performing deposition of the film according to the usual sputtering method. In this case, since the sputter etching is higher in etching rate at step portion than at the planar portion, the apparent deposition rate for step portions seems low, and a planar film is thus formed. The mechanism of planarization of insulating films by the bias sputtering method is described in "Study of Planarized Sputter-Deposited $SiO_2$" by C. Y. Ting et al., Journal of Vacuum Science and Technology, Vol. 15, No. 3, May/June, 1978, pp. 1105-1112.

The process of forming a planar insulating film by the bias sputtering method will now be described.

FIG. 3 is a sectional view showing the process of forming insulating films by the bias sputtering method. As can be seen in FIG. 3, in the bias sputtering method, insulating films are successively formed on an Al interconnection 2 as indicated by reference numerals 51 through 54. In this connection, if the pattern width of the Al interconnection 2 is small, as shown in FIG. 2, the insulating film can be easily planarized even if the insulating film is not deposited so thick on the Al interconnection 2. However, in the bias sputtering method, planarization of insulating films is proceeded in such a manner that the width of the underlying pattern to be covered is gradually decreased, as indicated by the reference numerals 51 through 54. Therefore, as shown in FIG. 4, if a wide Al interconnection 2 such as a power supply line is an underlying pattern to be covered, for perfect planarization of an insulating film 3 to be formed by the bias sputtering method it has been necessary that the film be sufficiently thick. To eliminate this drawback, a method has been proposed in which if the underlying pattern to be covered is wide, sputtering is performed by changing the substrate bias voltage midway through the process.

A method of forming planar insulating films using a two-step RF bias sputtering method is disclosed in Japanese Patent Application Laid-Open No. 200440/1984, applied for patent Apr. 28, 1983 by T. Mogami et al., "Method of Manufacturing an Interconnection Structure", and "$SiO_2$ Planarization by RF Bias Sputtering" by T. Mogami, 25th Symposium on Semiconductor Integrated Circuits Technique, Dec. 26, 1983.

The method of forming planar insulating films by the two-step RF bias sputtering method will now be described.

FIG. 5 is a view showing the process of formation of insulating layers by the bias sputtering method when a pattern is wide. In FIG. 5, a wide Al interconnection 2 is formed on a semiconductor substrate 1, and an interlayer insulating film 3 is formed thereon. This improved method will now be described with reference to FIG. 5. First, an oxide film 3 is formed by the bias sputtering method with a relatively low substrate bias voltage applied. At this time, as indicated by the reference numeral 61, there is formed an insulating film having a smoother coverage than that obtained by using the CVD method.

Then, the bias voltage is increased so that in the planar portion the rate of deposition by sputtering is equal to the rate of sputter removal. As a result, seemingly, there is neither deposition nor removal taking place in the planar portion, whereas in the step portions the sputter removal rate is higher than the sputter deposition rate, so that as indicated by the reference numerals 61 through 64 the removal proceeds to make planarization of insulating films possible. Even with this method, however, if the pattern width of the Al interconnection 2 is large, it takes a long time to planarize the insulating film and hence the time required to process one wafer or the like is very long; thus, the processing capacity has substantially been limited.

On the other hand, to increase the processing capacity, if the film is left as it is in the state shown at 61 in FIG. 5, then the step portion of the pattern of the Al interconnection 2 will have a thin region 7 of small effective thickness formed therein as shown in FIG. 6, leading to dielectric breakdown etc., which has been an obstacle to usage.

As described above, in the conventional bias sputtering method, though the coverage of the insulating film being formed is improved, perfect planarization of the insulating film being formed makes it necessary to increase the film thickness or to change the bias condition midway through the process for sputtering.

If insulating films are deposited to the thickness usually required of the planar portion by simply using the bias sputtering method, thin film portions are formed locally and particularly in the step portions, where dielectric breakdown will take place, which has been a problem in use.

SUMMARY OF THE INVENTION

Accordingly, an object of this invention is to provide a semiconductor device which eliminates the aforesaid drawbacks and which is capable of forming an insulating film with improved coverage easily and at low cost.

With this kind of problem taken into consideration, it will be seen that the quality of the coverage of an insulating film to be formed has only to be such as to cause no obstacle to the formation of a multilayer interconnection and the like. On the basis of this concept, in the present invention, a dummy pattern, preferably an insulator, is formed in advance in an area where imperfections are liable to occur, such as a step portion.

Specifically, a dummy pattern is formed along and around the outer periphery of an underlying pattern to be covered with a insulating film in a location where the width of the underlying pattern to be covered is more than twice the thickness of an insulating film to be formed thereon.

As a result of the formation of said dummy pattern, thin film portions with a small effective thickness which have heretofore formed in step portions are formed only at the dummy pattern, while the underlying pattern to be covered is covered with a planar insulating film. Therefore, imperfections, such as dielectric breakdown, which have heretofore been produced in thin film portions with a small effective thickness can be eliminated, and an insulating film having an improved coverage can be easily formed.

Other objects and features of the invention will become more apparent from the following detailed description to be given with reference to the accompanying drawings.

DESCRIPTION OF THE PREFERRED EMBODIMENTS

An embodiment of the invention will now be described with reference to the drawings.

Figure 7:
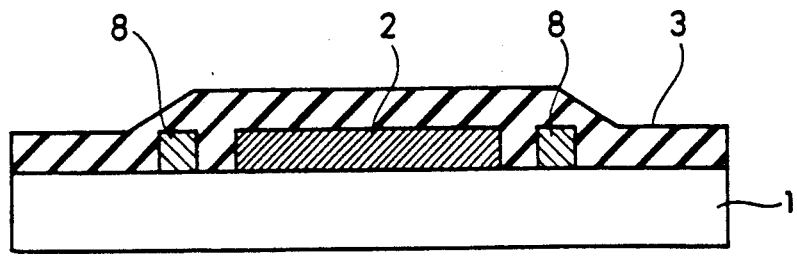
FIG. 7 is a sectional view schematically showing the construction of an insulating film, wherein a dummy pattern is provided according to an embodiment of the invention.

FIG. 7 is a cross-sectional illustration of a semiconductor device according to an embodiment of the invention. In FIG. 7, an underlying pattern 2 to be covered is, e.g., an Al interconnection formed on a semiconductor substrate 1. Further, as a feature of the present invention, a dummy pattern 8 preferably of insulating material is formed close to and around the outer periphery of the Al interconnection 2. An interlayer insulating film 3 is formed by the bias sputtering method to cover the substrate 1, the Al interconnection 2 and the dummy pattern 8. An embodiment of the invention will now be described with reference to FIG. 7.

Figure 1:
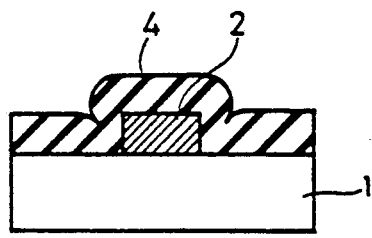
FIG. 1 is a view schematically showing the construction of an insulating film formed by using the conventional CVD method.
Figure 2:
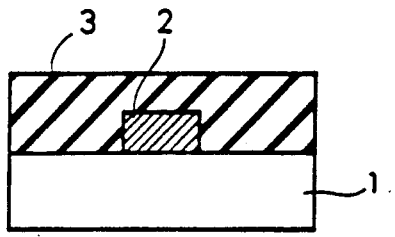
FIG. 2 is a view schematically showing the construction of an insulating film formed by the conventional bias sputtering method.
Figure 3:
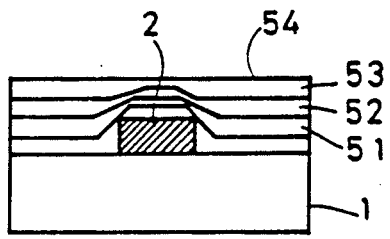
FIG. 3 is a view showing the process for forming an insulating film by the bias sputtering method.
Figure 4:
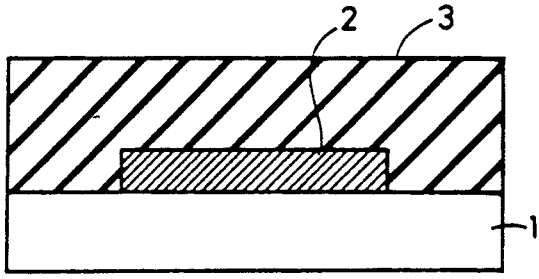
FIG. 4 is a view schematically showing the construction of a planar film formed by using the bias sputtering method when an underlying pattern to be covered is wide.
Figure 5:
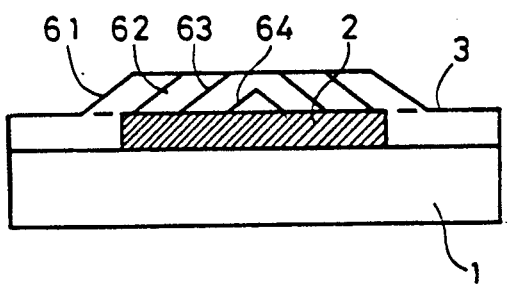
FIG. 5 is a view showing the process for forming an insulating film, wherein the insulating film is planarized by changing the substrate bias when an underlying pattern to be covered is wide.
Figure 6:
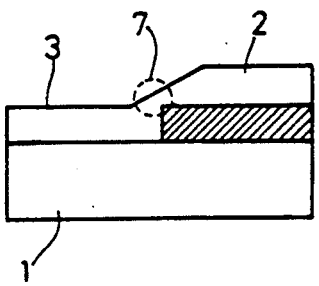
FIG. 6 is a view showing a thin film portion with a small effective thickness formed by the bias sputtering method.

As described above, at locations where the width of the pattern of the Al interconnection 2 is large, there has been a problem from the standpoint of coverage even if an interlayer insulating film is formed using the bias sputtering method. In this invention, to eliminate the aforesaid drawback, a dummy pattern 8 as shown in FIG. 7 is formed along and around the outer periphery of the wide Al interconnection 2. The width of the Al interconnection 2 is preferably more than twice the thickness of an insulating film to be formed thereon. Next, an insulating film 3 is formed using the bias sputtering method. If it is formed using the conventional CVD method, the space between the Al interconnection 2 and the dummy pattern 8 cannot be effectively filled with the insulating film and, moreover, the aforesaid necking and coverage imperfection will be produced. However, in this invention, the effect of the bias sputtering makes it possible to completely fill the space between the Al interconnection 2 and the dummy pattern 8 and to perfectly planarize the regions over the separation space. Further, by virtue of the dummy pattern 8 formed along and around the outer periphery of the Al interconnection 2, the aforesaid thin film portions with a small effective thickness (as shown at 7 in FIG. 6) are formed at the dummy pattern 8 rather than around the Al interconnection 2. Further, the use of the bias sputtering method ensures that the coverage of the insulating film 3 at the dummy pattern 8 is much better than that obtained by the conventional CVD method.

In addition, in the above embodiment, the film formed by the bias sputtering method has been described as an interlayer insulating film. However, the same effect as that described above can be obtained in forming a passivation film by applying the invention.

In the above embodiment, while the underlying pattern to be covered has been described as an Al interconnection, it is not limited thereto; it goes without saying that the same effect can be obtained even if it is, for example, an aluminum alloy interconnection.

As described above, in this invention, after a dummy pattern has been formed along and around the outer periphery of a wide underlying pattern to be covered, an insulating film is formed using the bias sputtering method. Therefore, there is no need to introduce a new troublesome processing step as compared with the prior art. There is no possibility of imperfections such as dielectric breakdown due to unsatisfactory coverage as in the prior art CVD method. There is no need to increase the thickness of an insulating film to be deposited or to change the substrate bias voltage midway through the film deposition, which are needed when the bias sputtering method alone is used. Therefore, according to the invention, a planar insulating film with good coverage can be obtained easily and at low cost. Further, a highly reliable insulating film can be easily obtained without lowering the processing capacity of the bias sputtering method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an interconnection formed on a semiconductor substrate,
   a dummy pattern formed around the outer periphery of said interconnection and
   a bias sputtered insulating film formed on said semiconductor substrate to cover said interconnection and said dummy pattern, said bias sputtered insulating film consisting essentially of first generally planar surface portions extending generally parallel to the semiconductor substrate and step portions extending between said first portions, said step portions also being planar surfaces along substantially their entire extent, wherein said dummy pattern is formed close to said interconnection and in separated relation thereto, said dummy pattern being electrically isolated from the interconnection and acting as a spacer to increase the thickness of the insulating film proximate the outer periphery of the interconnection whereby said bias sputtered first portions overlie said outer periphery, said bias sputtered step portions overlie the dummy pattern.

2. A semiconductor device as set forth in claim 1, wherein said interconnection is formed using aluminum or an aluminum alloy.

3. A semiconductor device as set forth in claim 1, wherein said dummy pattern in formed using an insulating material.

4. A semiconductor device as set forth in claim 1, wherein said dummy pattern is formed around the outer periphery of said interconnection whose width is more than twice the thickness of the insulating film to be formed thereon.

5. The semiconductor device of claim 1, wherein said insulating film is formed without variation of substrate bias voltage during the bias sputtering.

* * * * *